United States Patent [19]

Hunter et al.

[11] Patent Number: 4,893,311

[45] Date of Patent: Jan. 9, 1990

[54] CMOS IMPLEMENTATION OF A BUILT-IN SELF TEST INPUT GENERATOR (BISTIG)

[75] Inventors: Craig C. Hunter, Vancouver, Wash.; Thomas S. Spohrer, Austin, Tex.

[73] Assignee: Motorola, Inc., Schaumburg, Ill.

[21] Appl. No.: 185,610

[22] Filed: Apr. 25, 1988

[51] Int. Cl.⁴ .............................................. G06F 11/00
[52] U.S. Cl. ................................... 371/22.5; 371/25.1
[58] Field of Search ....................... 371/27, 21, 25, 15, 371/20

[56] References Cited

U.S. PATENT DOCUMENTS

| | | | |
|---|---|---|---|
| 4,418,410 | 11/1983 | Goetze | 371/15 |
| 4,461,000 | 7/1984 | Young | 371/21 |
| 4,546,473 | 10/1985 | Eichelberger | 371/25 |
| 4,672,610 | 6/1987 | Salick | 371/27 |

Primary Examiner—Michael R. Fleming
Attorney, Agent, or Firm—Robert L. King

[57] ABSTRACT

A CMOS implementation of a Built In Self Test Input Generator (BISTIG) for testing embedded PLA structures. The BISTIG tests for all stuck at faults, crosspoint faults and bridging faults, by asserting exactly one input row and exactly one product term of the PLA under test at a time.

3 Claims, 2 Drawing Sheets

CMOS IMPLEMENTATION OF A BUILT-IN SELF TEST INPUT GENERATOR (BISTIG)

FIELD OF THE INVENTION

The present invention relates, in general, to a technique for testing a PLA. More particularly, the present invention relates to a CMOS implementation of a Built In Self Test Input Generator (BISTIG).

BACKGROUND OF THE INVENTION

In a complex integrated circuit such as a microprocessor, Programmable Logic Arrays (PLAs) typically have limited controllability of any input and are inaccessible at the outputs. This makes it very difficult to detect faults in the PLA, such as stuck-at faults, cross-point faults and bridging faults. It is, therefore, desirable to incorporate into the PLA some type of Design For Test technique, to allow for proper and complete testing. One such technique is a Built In Self Test (BIST) with input control generation approach.

The basic concept of BISTIG is to be able to assert exactly one row and exactly one product term at one time. In this way, all failures can be uncovered. Without a procedure like this, it is virtually impossible to fully test all failure modes because of the redundancies in a PLA that render some faults untestable. PLAs also contain a significant amount of reconvergent fanout which also makes it very difficult to fully verify the PLA.

In U.S. Pat. No. 4,672,610, a "Built in Self Test Input Generator" is described. However, that BISTIG was suitable for use in an integrated circuit fabricated using an NMOS process technology, and is less than ideal for use in an integrated circuit fabricated using CMOS process technology.

SUMMARY OF THE INVENTION

It is therefore an object of the present invention to provide an improved Built In Self Test Input Generator (BISTIG).

Yet another object is to provide a BISTIG that is particularly well adapted for use in an integrated circuit fabricated in a CMOS process technology.

Yet another object is to provide an improved CMOS implementation of a BISTIG which is readily integratable with an integrated circuit such as a microprocessor utilizing a minimum number of components and on-chip area.

These and other objects are achieved in a Built In Self Test Input Generator (BISTIG) for a Programmable Logic Array (PLA), wherein the PLA comprises a first level array adapted to receive N input signals in N input lines and to provide M product terms on M product term lines, and a second level array adapted to receive the M product terms on the M product term lines and to provide P output signals on P output lines, wherein N, M, and P are integers greater than one, the BISTIG having a product term selector which sequentially enables each of the M product term lines of the second level array individually in response to a first control signal. In accordance with the present invention, the BISTIG includes an improved test vector generator comprising: initialization logic for selectively generating an initial N-bit vector comprising N-1 logical zeroes and a single logical one in response to a second control signal; an N-stage, recirculating shift register for selectively generating one of N test vectors by sequentially shifting each of the N-bits comprising the initial vector by one bit in response to a third control signal; a mux for selectively coupling each of the N-bits comprising the one test vector to a corresponding one of the N input lines in response to a fourth control signal; and control logic for receiving a test signal and each of a plurality of clock pulses, and selectively providing the first control signal each time the shift register recirculates the logical one, the second signal in response to first receiving the test signal, the third control signal in response to receiving each clock pulse, and the fourth control signal substantially continuously while receiving the test signal.

DESCRIPTION OF THE PREFERRED EMBODIMENT

Figure 1A:
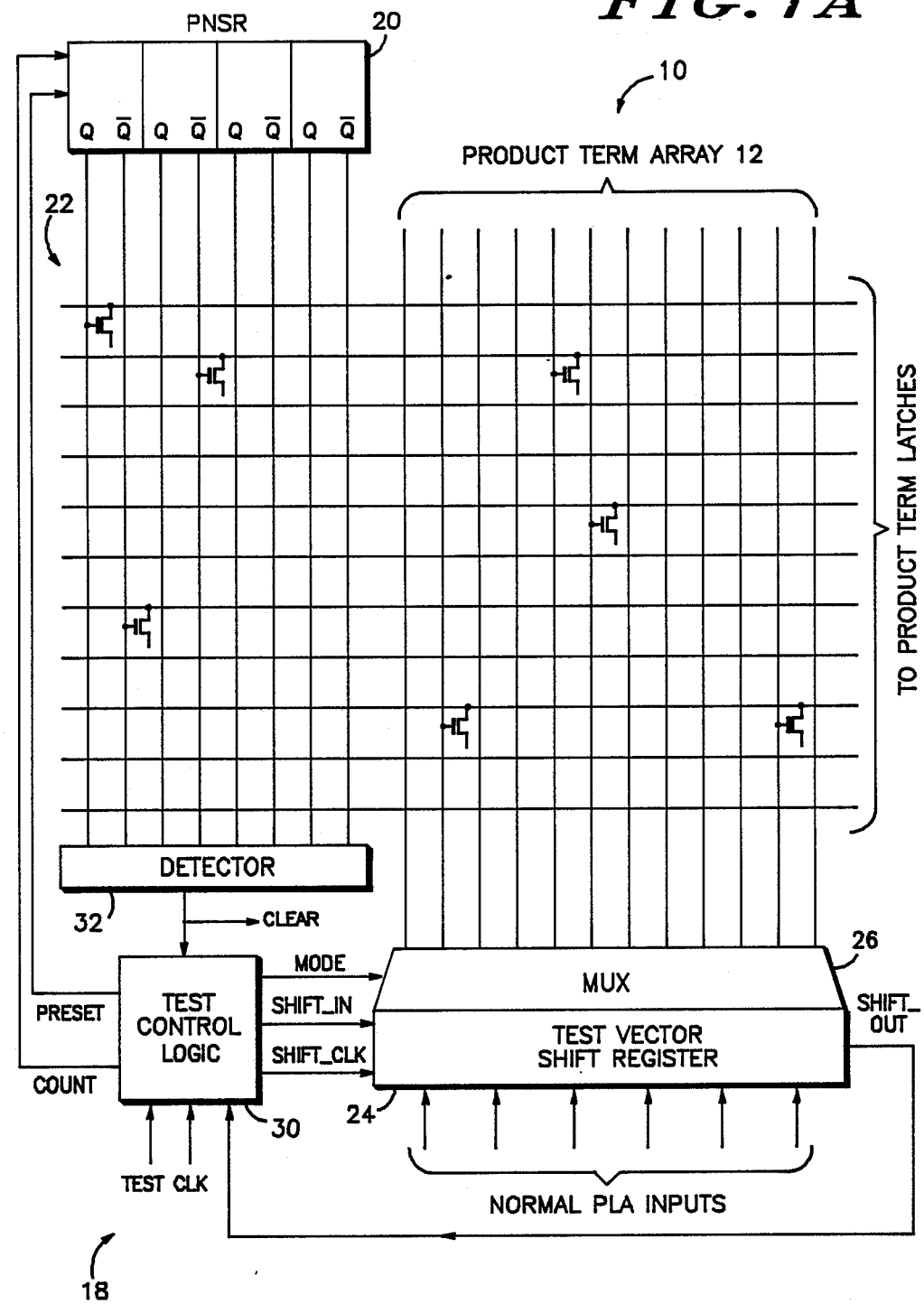
FIGS. 1A and 1B, when placed side by side, illustrate in block diagram form a Programmable Logic Array (PLA) having a Built In Self Test Input Generator (BISTIG) constructed in accordance with the present invention.
Figure 1B:
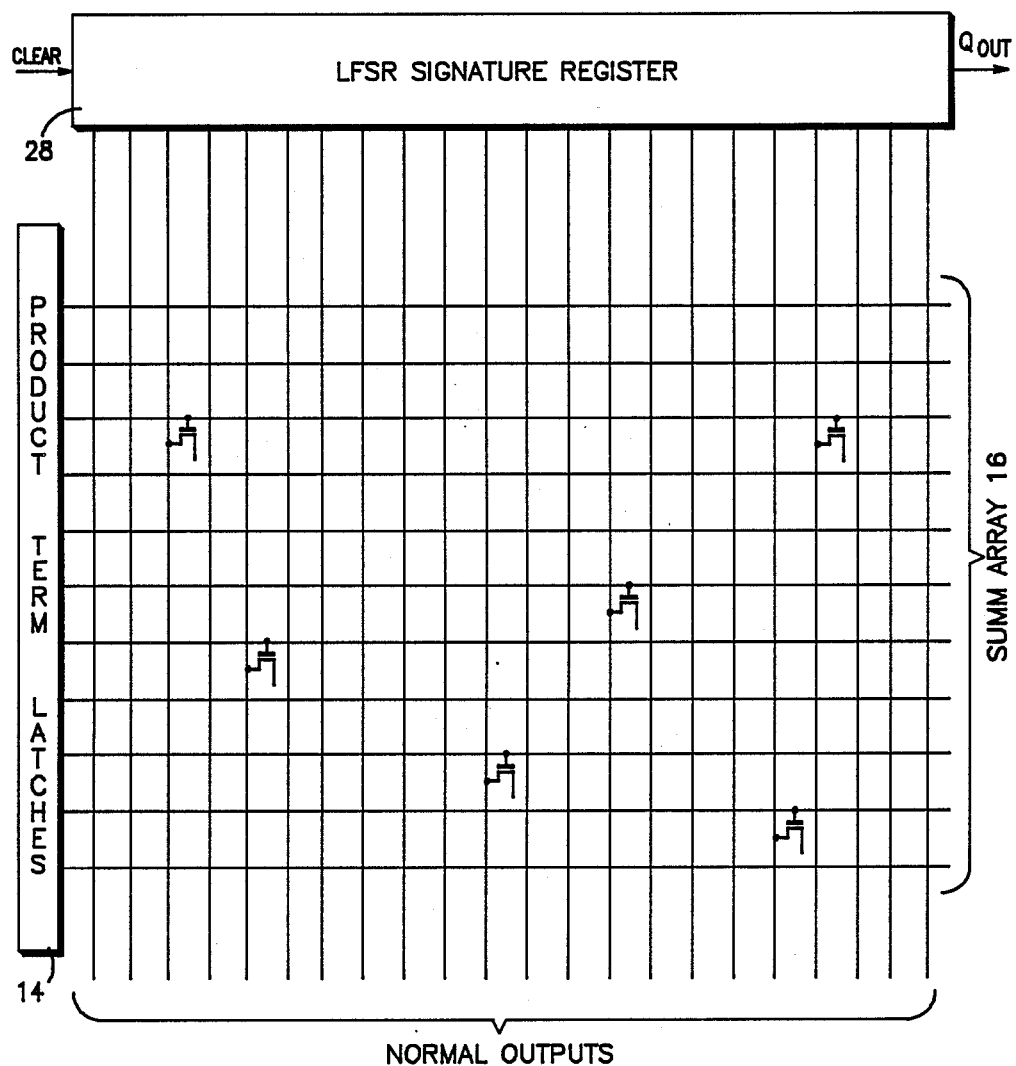

Shown in FIGS. 1A and 1B is a conventional Programmable Logic Array (PLA) 10 suitable for implementation in CMOS. In general, PLA 10 includes a first level or product term array 12 which, in normal operation, is responsive to a set of input signals (NORMAL INPUTS), a set of product term latches 14, and a second level or sum array 16 which normally provides a set of outputs (NORMAL OUTPUTS).

In the illustrated form, PLA 10 is provided with a Built In Self Test Input Generator (BISTIG) 18 constructed in accordance with the present invention. In general, BISTIG 18 includes a pseudo-random noise shift register (PNSR) 20 for generating a selected sequence of random numbers for sequentially selecting each of the product term lines of the product array 12 via a product term decoder 22, a test vector shift register 24 for generating a selected set of "test vectors" for sequential presentation to the product array 12 via a mux 26, and a linear feedback shift register (LFSR) 28 for continuously calculating the "signature" of the resulting set of outputs of the sum array 16.

In response to receiving a TEST signal from a conventional tester, for example, test control logic 30 will assert a PRESET signal to initialize the PNSR 20 to a starting value, and thereafter assert a COUNT signal in synchronism with an externally generated CLOCK signal, to increment the count in the PNSR 20. Coincident with each COUNT signal, test control logic 30 will negate a SHIFT_IN signal and assert a SHIFT_CLK signal to shift a logical zero into the test vector shift register 24. Accordingly, an initial "test vector", consisting of a set of logical zeroes, will be sequentially constructed in the test vector shift register 24.

When the value in the PNSR 20 corresponds to the number of stages of the test vector shift register 24 (i.e. the number of NORMAL INPUTS to the product array 12), a detector 32 will assert a CLEAR signal to clear the LFSR 28. In response to the CLEAR signal, test control logic 30 will assert the SHIFT_IN signal for one SHIFT_CLK, to shift a single logical one into the first stage of the test vector shift register 24, so that the "test vector" now consists of a set of logical zeroes with a logical one in the first stage. Test control logic 30 will now assert a MODE signal to enable the mux 26 to apply this "test vector" in the test vector shift register 24 to the product array 12. As appropriate, test control logic 30 may also PRESET the PNSR 20 at this time.

In synchronism with subsequent CLOCK pulses, test control logic 30 will continue to assert the SHIFT_CLK, but will assert the COUNT signal only when the SHIFT OUT of the test vector shift register 24 is a logic one. Thus, the single logical one will be continuously recirculated through the test vector shift register 24. However, each time the logical one is recirculated, test logic control 30 will assert the COUNT signal to increment the "product term address" provided by the PNSR 20. In effect, for each product term in the product array 12, a set of "test vectors" are provided by the test vector shift register 24 wherein the logical one is "walked" through a field of all logical zeroes. After the tester (not shown) has provided an appropriate number of CLOCK signals, the LFSR 28 can be cycled in a conventional manner to retrieve the current "signature" for analysis.

In response to the negation of the TEST signal, indicating that no further self-testing is desired, the test control logic 30 will negate the MODE signal to enable the mux 22 to reconnect the NORMAL INPUTS to the product array 12. Thereafter, test control logic 30 will cease operation.

In the preferred form, the test vector shift register 24 allows a logical one to be independently applied to both the true and complement outputs of the mux 22. Once the "test vector" has been initialized, each input to the product array 12 will be asserted individually, as the single logical one is shifted through the field of logical zeroes. When the logical one is shifted out of the last stage of the test vector shift register 24, the PNSR 20 is incremented by the SHIFT_OUT signal, enabling the next product term line in the product array 12, while the logical one is looped back to the first stage of the test vector shift register 24. In general, the LFSR 28 is used to collect the outputs of the sum array 16 for comparison to the corresponding signature of a correct PLA.

Although the present invention has been disclosed herein in the context of a preferred embodiment, various changes, additions, deletions, and modifications may be made in that embodiment without departing from the spirit and scope of the present invention. For example, although the BISTIG disclosed herein is particularly well adapted for implementation in a CMOS process technology, the embodiment as disclosed herein may be easily adapted for testing an embedded PLA implemented in other process technologies, such as NMOS, ECL or gallium arsenide. In general, however, the CMOS design for the BISTIG of the present invention optimizes the use of components to minimize the speed degradation due to built in test logic.

We claim:

1. In a built in self test input generator (BISTIG) for a programmable logic array (PLA), wherein the PLA comprises a first level array adapted to receive N input signals in N input lines and to provide M product terms on M product term lines, and a second level array adapted to receive the M product terms on the M product term lines and to provide P output signals on P output lines, wherein N, M, and P are integers greater than one, the BISTIG having a product term selector which sequentially enables each of the M product term lines of the second level array individually in response to a first control signal, an improved test vector generator comprising:

initialization means for selectively generating an initial N-bit vector comprising N-1 logical zeroes and a single logical one in response to a second control signal;

N-stage, recirculating shift register means, coupled to said initialization means, for selectively generating one of N test vectors by sequentially shifting each of said N-bits comprising said initial vector by one bit in response to a third control signal;

coupling means, coupled to said shift register means and to said N input lines of said PLA, for selectively coupling each of said N-bits comprising said one test vector to a corresponding one of said N input lines in response to a fourth control signal, thereby allowing said single logical one to be shifted across a true and a complement of said N input lines; and control means, coupled to said product term selector, to said initialization means, to said shift register means and to said coupling means, for receiving a test signal and each of a plurality of clock pulses, and selectively providing said first control signal each time said shift register means recirculates said logical one, thereby incrementing a product term address provided by said product term selector, and selectively providing said second control signal in response to first receiving said test signal, thereby initializing said product term selector to an initial value, and selectively providing said third control signal in response to receiving each clock pulse, thereby shifting said single logical one into one of said N-stages of said shift registers means, and providing said fourth control signal substantially continuously while receiving said test signal.

2. The BISTIG of claim 1 wherein the coupling means further comprises multiplexing means for receiving said N input signals in N input lines, and for selectively providing a true or complement of said N input signals to said first level array, in response to said fourth control signal.

3. The BISTIG of claim 1 wherein said BISTIG includes a linear feedback shift register (LFSR) for receiving said P output signals on P output lines of the second array, and for comparing said P output signals to a signature of said correct PLA.

* * * * *